(12) United States Patent
Yamazaki

(10) Patent No.: US 10,043,775 B2
(45) Date of Patent: Aug. 7, 2018

(54) BONDING MATERIAL, BONDING METHOD AND SEMICONDUCTOR DEVICE FOR ELECTRIC POWER

(71) Applicant: MITSUBISHI ELECTRIC CORPORATION, Chiyoda-ku (JP)

(72) Inventor: Koji Yamazaki, Chiyoda-ku (JP)

(73) Assignee: MITSUBISHI ELECTRIC CORPORATION, Chiyoda-ku (JP)

(*) Notice: Subject to any disclaimer, the term of this patent is extended or adjusted under 35 U.S.C. 154(b) by 0 days.

(21) Appl. No.: 15/112,078

(22) PCT Filed: Dec. 26, 2014

(86) PCT No.: PCT/JP2014/084497
§ 371 (c)(1),
(2) Date: Jul. 15, 2016

(87) PCT Pub. No.: WO2015/118790
PCT Pub. Date: Aug. 13, 2015

(65) Prior Publication Data
US 2016/0351523 A1    Dec. 1, 2016

(30) Foreign Application Priority Data
Feb. 10, 2014 (JP) ................................. 2014-022948

(51) Int. Cl.
*H01L 29/15* (2006.01)
*H01L 23/00* (2006.01)
(Continued)

(52) U.S. Cl.
CPC .............. *H01L 24/29* (2013.01); *B23K 20/00* (2013.01); *B23K 20/026* (2013.01);
(Continued)

(58) Field of Classification Search
CPC ........... H01L 23/4334; H01L 23/49513; H01L 23/49551; H01L 24/29; H01L 23/3735
See application file for complete search history.

(56) References Cited

U.S. PATENT DOCUMENTS

2006/0214291 A1    9/2006  Sasaki et al.
2008/0131308 A1    6/2008  Tsubota et al.
(Continued)

FOREIGN PATENT DOCUMENTS

JP    2006-269848 A    10/2006
JP    2008-156753 A     7/2008
(Continued)

OTHER PUBLICATIONS

International Search Report dated Mar. 31, 2015 in PCT/JP2014/084497 Filed Dec. 26, 2014.
(Continued)

*Primary Examiner* — Elias M Ullah
(74) *Attorney, Agent, or Firm* — Oblon, McClelland, Maier & Neustadt, L.L.P.

(57) ABSTRACT

The present invention has an object to achieve bonding which satisfies both in heat resistivity and in stress-relaxation ability, and the bonding material according to this invention is a sheet-like bonding material 1 made of a silver-bismuth alloy which, when heated in a state being in contact with a metal material as a bonding target (for example, surface layers 2*f*, 3*f*), forms in the metal material (as its material, for example, gold, silver or copper) a diffusion layer Ld2, Ld3 of silver due to solid-phase diffusion reaction, so as to be bonded to the metal material, said bonding material being characterized by containing not less than 1 mass % but not more than 5 mass % of bismuth.

18 Claims, 3 Drawing Sheets

(51) Int. Cl.
  *B23K 35/30* (2006.01)
  *B23K 20/00* (2006.01)
  *C22C 5/06* (2006.01)
  *C22C 12/00* (2006.01)
  *C22C 13/00* (2006.01)
  *H01L 23/373* (2006.01)
  *H01L 23/433* (2006.01)
  *H01L 23/495* (2006.01)
  *H05K 3/34* (2006.01)
  *B23K 20/02* (2006.01)
  *B23K 35/02* (2006.01)
  *C22F 1/14* (2006.01)
  *H01L 29/16* (2006.01)
  *H01L 29/20* (2006.01)
  *H05K 1/02* (2006.01)
  *H05K 1/03* (2006.01)
  *B23K 101/40* (2006.01)

(52) U.S. Cl.
  CPC .......... *B23K 35/0233* (2013.01); *B23K 35/30* (2013.01); *B23K 35/3006* (2013.01); *C22C 5/06* (2013.01); *C22C 12/00* (2013.01); *C22C 13/00* (2013.01); *C22F 1/14* (2013.01); *H01L 23/3735* (2013.01); *H01L 23/4334* (2013.01); *H01L 23/49513* (2013.01); *H01L 23/49551* (2013.01); *H01L 23/49562* (2013.01); *H01L 23/49575* (2013.01); *H01L 24/36* (2013.01); *H01L 24/40* (2013.01); *H01L 24/83* (2013.01); *H01L 29/1602* (2013.01); *H01L 29/2003* (2013.01); *H05K 3/3463* (2013.01); *B23K 2201/40* (2013.01); *H01L 2224/29139* (2013.01); *H01L 2224/32225* (2013.01); *H01L 2224/40095* (2013.01); *H01L 2224/40137* (2013.01); *H01L 2224/8383* (2013.01); *H01L 2224/83101* (2013.01); *H01L 2924/014* (2013.01); *H01L 2924/01047* (2013.01); *H01L 2924/01083* (2013.01); *H01L 2924/13055* (2013.01); *H01L 2924/13091* (2013.01); *H01L 2924/181* (2013.01); *H05K 1/0271* (2013.01); *H05K 1/0306* (2013.01)

(56) References Cited

U.S. PATENT DOCUMENTS

2008/0174872 A1* 7/2008 Morimoto ............. G02B 5/208
  359/585
2009/0139860 A1   6/2009 Matsuzaki
2014/0103531 A1   4/2014 Nakamura et al.

FOREIGN PATENT DOCUMENTS

| JP | 2009-132962 A | 6/2009 |
| JP | 2010-267579 A | 11/2010 |
| JP | 2011-198674 A | 10/2011 |
| JP | 2011-243752 A | 12/2011 |
| JP | 2012-54358 A  | 3/2012 |
| JP | 2012-253242 A | 12/2012 |

OTHER PUBLICATIONS

Combined Chinese Office Action and Search Report dated Oct. 31, 2017 in Patent No. 201480073843.2 (with English language translation and English translation of categories of cited documents).

* cited by examiner

BONDING MATERIAL, BONDING METHOD AND SEMICONDUCTOR DEVICE FOR ELECTRIC POWER

TECHNICAL FIELD

The present invention relates to a sheet-like bonding material whose heat resistant temperature after bonding becomes higher due to use of solid-phase diffusion reaction of silver than a bonding temperature and, a bonding method and a semiconductor device for electric power each using the same.

BACKGROUND ART

In recent years, there is an increasingly growing demand of reliability for semiconductor devices for electric power, and in particular, there is a demand to improve durability and reliability of a bonding portion between a semiconductor element for electric power and a circuit board having a large difference in thermal expansion coefficient therebetween. Heretofore, semiconductor elements for electric power whose base materials are silicon (Si) and gallium arsenide (GaAs) have been often used, and their operation temperatures are from 100° C. to 125° C. When these elements are bonded to circuit boards, soldering materials have been often used.

On the other hand, from the aspect of saving energy, semiconductor elements for electric power whose base materials are silicon carbide (SiC) and gallium nitride (GaN) have been under active development as next-generation devices.

They operate with a large current and have operation temperatures of 175° C. or more, and it is said that the temperature will become 300° C. in future. On that occasion, in the case where bonding is made by melting a bonding material itself, such as a solder, it is required to make bonding at a temperature higher than a heat resistant temperature of the bonding portion, so that, not just the number of choices for a bonding material itself is limited, there are restrictions to prevent degradation of the bonding target.

In this respect, attention is paid to a bonding material which is a so-called sinterable metal or metal paste and in which nano or micron-sized metal particles and an organic solvent are mixed together (see, for example, Patent Document 1). According to such a bonding material, when the organic component covering the surfaces of the metal particles is decomposed by heat, the metal particles are sintered with each other to form a bonding portion and the heat resistant temperature after sintering (bonding) becomes a temperature (for example, 960° C. in the case of silver) that is nearly equal to the melting point of the solid metal. Though depending on what the organic component is, the organic solvent is decomposed at about 200 to 300° C., so that it is possible to make bonding at a temperature where the bonding target is not degraded, and to achieve enhanced heat resistance after bonding.

Meanwhile, as described in Patent Document 1, in comparison with the solid metal, the metal-sintered material has a lower elastic modulus due to having voids. Notwithstanding, it is still higher in elastic modulus in comparison with the conventional solders, etc., so that its stress-relaxation ability in heat cycle decreases and thus, it is difficult to keep the bonding strength over a long period of time. In this respect, there is proposed a technology in which particles having lubricating ability or fillers of a resin being lower in elastic modulus than the metal particles are mixed in the bonding material to thereby relax stress (see, for example, Patent Document 2 or 3).

CITATION LIST

Patent Document

Patent Document 1: Japanese Patent Application Laid-open No. 2012-054358 (Paragraph 0010; FIG. 1)
Patent Document 2: Japanese Patent Application Laid-open No. 2010-267579 (Paragraph 0013; FIG. 1)
Patent Document 3: Japanese Patent Application Laid-open No. 2011-198674 (Paragraphs 0010 to 0013; FIG. 1, FIG. 2)

SUMMARY OF THE INVENTION

Problems to be Solved by the Invention

However, it is difficult to make the heat resistant temperature of the resin material higher than an operation temperature estimated for the next-generation device, and if used in a high temperature, this results in reduction of the bonding strength due to degradation of the resin in the bonding material. Namely, it is difficult to achieve bonding which satisfies both in heat resistivity and in stress-relaxation ability.

The present invention has been made to solve the problems as described above, and an object thereof is to achieve bonding which satisfies both in heat resistivity and in stress-relaxation ability.

Means for Solving the Problems

The bonding material according to this invention is a sheet-like bonding material made of a silver-bismuth alloy which, when heated in a state being in contact with a metal material as a bonding target, forms in the metal material a diffusion layer of silver due to solid-phase diffusion reaction, so as to be bonded to the metal material, said bonding material being characterized by containing not less than 1 mass % but not more than 5 mass % of bismuth.

Further, the bonding method according to the invention is characterized by including a heat treatment step of heat treating the above bonding material at a temperature of not less than 150° C. but not more than 300° C., and a diffusion-layer forming step of sandwiching the bonding material after subjected to the heat treatment step between two bonding targets, and heating them at a temperature lower than a melting point of the bonding material, to thereby form a diffusion layer of silver in each of said two bonding targets.

Further, the semiconductor device for electric power according to the invention is characterized by comprising a circuit board on which a circuit pattern is formed and a semiconductor element for electric power bonded to the circuit pattern, wherein the semiconductor element for electric power and the circuit pattern are bonded by the above bonding method.

Effect of the Invention

According to this invention, because bismuth is added by a ratio in a specific range to silver, it is possible to achieve bonding which satisfies both in heat resistivity and in stress-relaxation ability. Further, using such bonding, it is possible to provide a high-temperature compatible and highly-reliable semiconductor device for electric power.

MODES FOR CARRYING OUT THE INVENTION

Embodiment 1

Figure 1A:
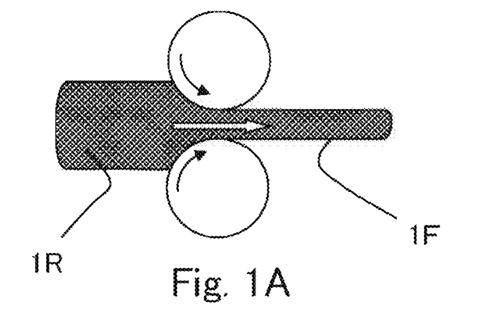
FIG. 1A, FIG. 1B and FIG. 1C is cross-sectional views, at respective steps, of a bonding material or a bonding portion, for illustrating a bonding method using the bonding material according to Embodiment 1 of the invention.
Figure 1B:
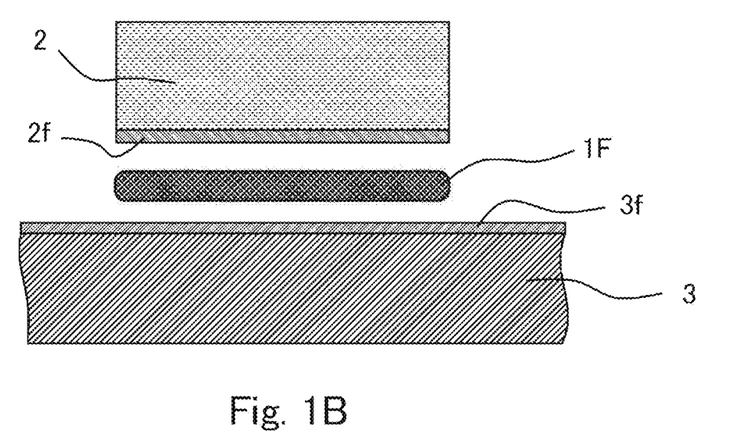
Figure 1C:
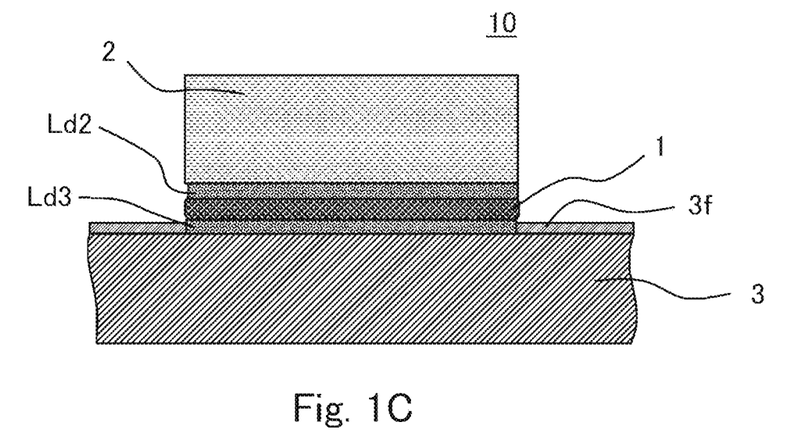
Figure 2:
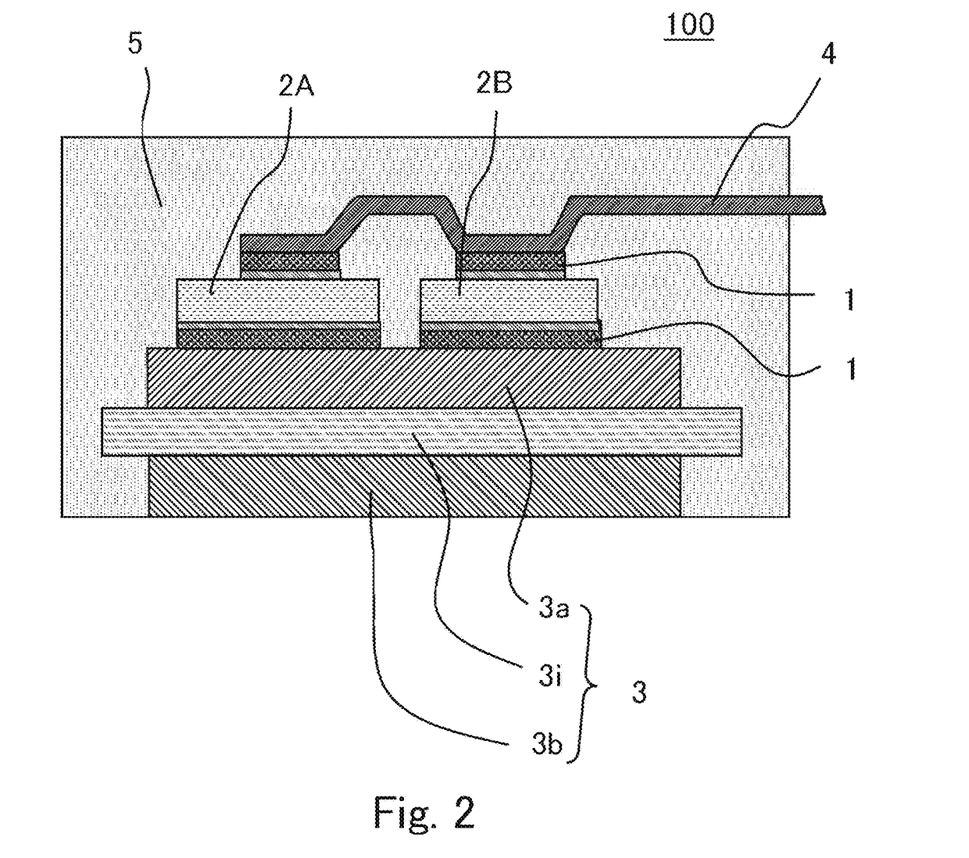
FIG. 2 is a cross-sectional view showing a configuration of a semiconductor device for electric power manufactured using the bonding material and the bonding method according to Embodiment 1 of the invention.

FIG. 1 and FIG. 2 are figures for illustrating a bonding material, a bonding method using the bonding material and a semiconductor device for electric power manufactured using them, according to Embodiment 1 of the invention. FIG. 1 is cross-sectional views, at respective steps, of the bonding material or the bonding portion at the time of bonding a semiconductor element for electric power to a circuit board using the bonding material, in which FIG. 1A is a cross-sectional schematic view showing how an alloy material is rolled into a thin-film form in order to be used as the bonding material, FIG. 1B is a cross-sectional view showing a state before bonding targets are bonded to each other, and FIG. 1C is a cross-sectional view showing a state of bonding portion after bonding. Further, FIG. 2 is a cross-sectional view showing a configuration of a semiconductor device for electric power after bonding (manufactured) using the bonding material and the bonding method.

Prior to describing the bonding material and the bonding method using the bonding material, a configuration of a semiconductor device for electric power which is a preferably applicable object of them will be described.

As shown in FIG. 2, a semiconductor device for electric power 100 is that in which vertical semiconductor elements for electric power 2A, 2B (collectively, semiconductor elements for electric power 2) are mounted on the circuit face side (conductive layer 3a) of a DBC board 3 (Direct Bonded Copper) as the circuit board in which copper (Cu) conductive layers 3a, 3b are formed on both sides of a base material 3i made of silicon nitride ($Si_3N_4$). Onto each of surface electrodes of the semiconductor elements for electric power 2A, 2B, a lead terminal 4 as a wiring material is bonded by use of a sheet-like bonding material 1 mainly configured by silver, and their back faces are also bonded to the DBC board 3 by use of a bonding material 1. Further, except for the back face (conductive layer 3b)-side of the DBC board 3 and for the end-side of the lead terminal 4 to be connected to an external circuit, they are sealed overall by a sealing material 5 to be formed into a package.

Each semiconductor element for electric power 2 may be a usual element using a silicon wafer as its base material. However, in this invention, for the purpose of application of a so-called wide bandgap semiconductor material such as silicon carbide (SiC), a gallium nitride (GaN) or diamond, that is wider in bandgap than silicon, silicon carbide is applied as for the base material. Examples of device type include: a switching element such as an IGBT (Insulated Gate Bipolar Transistor) or a MOSFET (Metal Oxide Semiconductor Field-Effect-Transistor); and a rectifier element such as a diode. For example, in the case of the MOSFET, a drain electrode is formed on a surface of the semiconductor element for electric power 2 that is placed toward the DBC board 3. Further, on a surface in the opposite side to the drain electrode (upper side in the figure), a gate electrode and a source electrode are formed to be regionally separated from each other; however, for simplifying explanation, description will be made by illustrating only a source electrode for electric main-power on the upper-side surface.

The DBC board 3 has a size of 40 mm×40 mm, whose thickness-wise configuration is: the conductive layer 3a: 0.4 mm/the base material 3i: 0.3 mm/the conductive layer 3b: 0.4 mm. With respect to the drain electrode in the electrodes of the semiconductor element for electric power 2, its surface serving as a bonding face to the DBC board 3 (through the bonding material 1) is covered with gold (Au: surface layer 2f). Further, a surface in those of the conductive layers 3a, 3b of the DBC board 3, that serves as a bonding face to the semiconductor element for electric power 2 (through the bonding material 1), is covered with silver (Ag: surface layer 3f). Here, the semiconductor device for electric power 100 according to Embodiment 1 of the invention is characterized by the use of a silver-bismuth alloy (alloy foil 1F) containing from 1 to 5 wt % of bismuth (Bi), as the bonding material 1, for bonding at least between the semiconductor element for electric power 2 and the circuit board (for example, DBC board 3) or a wiring material (for example, lead terminal 4). Further, the bonding method is characterized by the provision of heat treatment step in which the alloy foil 1F before bonding is held at a temperature of 150° C. to 300° C. for 10 to 100 hours.

Note that the bonding material 1 is an alloy that is composed mainly of silver, and serves to make bonding in such a manner that silver components staying nearer to its surface that is in contact with the bonding target, cause solid-phase diffusion into a bonding face-covering metal of the bonding target to thereby form a diffusion layer of silver. Accordingly, this bonding material 1 does not change in its shape between before and after bonding generally. Thus, in this DESCRIPTION in particular at the time of describing processes, there is a case of writing "alloy foil 1F" when showing a state before bonding; however, this does not mean that it is different to the bonding material 1.

In order to optimize the composition and the heat treatment condition (temperature, holding time) of the bonding material 1, first, using a bismuth content as a parameter, alloys in a thin-film form (alloy foils 1F) to be used as bonding materials 1 were prepared, and the absence/presence of rolling crack at the time of being formed into the thin-film form was evaluated. Then, using alloy foils having compositions that did not cause rolling crack, the semiconductor element for electric power 2 and the DBC board 3 were actually bonded together by use of each of that alloy foils 1F to prepare each bonded object 10 (referred to as evaluation sample 10S) as shown in FIG. 1, which was then evaluated in heat-cycle resistivity using a thermal shock (heat cycle) test. In the following, description will be made in detail.

<Preparation of Alloys (Foils)>

Granulated silver with a purity of 99.9 wt % and powdered bismuth (acicular shape) were each weighed by an electronic scale so that the bismuth content (wt %) in the alloy became an intended content, and charged into a crucible made of quarts glass, where they were melted by heating in the atmosphere using a gas torch or a highfrequency induction heating apparatus. While holding the furnace at a melting point of silver or more as a whole, they were stirred using a quartz glass protective tube so that bismuth was dispersed evenly, and then cooled and solidified, to thereby prepare each sample alloy 1R. Thereafter, as shown in FIG. 1A, the sample alloy 1R was subjected to rolling processing to thereby prepare an Ag—Bi alloy thin film (alloy foil 1F) having a thickness: 50 to 100 μm and a width: 40 mm.

<Bismuth Content>

As an evaluation result, "○" is given if a rolling crack of 3 mm or more did not occur at the both end portions of the alloy foil 1F by the rolling processing at the time of preparation of the alloy foil 1F, whereas "×" is given if such a rolling crack occurred. Six evaluation samples 10S (Examples 1 to 3, Comparative Examples 1 to 3) were prepared while varying the content of bismuth from 0.5 wt % to 7 wt %, and then evaluated. The evaluation results are shown in Table 1. Note that with resect to the preparation method of the alloy foils 1F, a sheet molding method, press molding, a powder burning method or the like, may be applied thereto, so that it is not limited to rolling processing.

TABLE 1

Parameter Test Result 1

| Test Object | Test Condition | | | Evaluation Result | |
| --- | --- | --- | --- | --- | --- |
| | Bi Content [wt %] | Annealing Condition | | Rolling Crack | H/C Resistivity |
| | | Temperature [° C.] | Time [hrs] | | |
| Comparative Example 1 | 0.5 | 200 | 48 | ○ | X |
| Example 1 | 1 | 200 | 48 | ○ | ○ |
| Example 2 | 3 | 200 | 48 | ○ | ○ |
| Example 3 | 5 | 200 | 48 | ○ | ○ |
| Comparative Example 2 | 6 | 200 | 48 | Δ | X |
| Comparative Example 3 | 7 | 200 | 48 | X | — |

As a result, it is shown that, when compared on the same rolling-process basis, when the bismuth content is from 1 to 5 wt %, as exemplified by 0.5 wt % (Comparative Example 1), 1 wt % (Example 1), 3 wt % (Example 2) and 5 wt % (Example 3), no rolling crack occurred, thus providing an excellent result (○). When the bismuth content was 6 wt % (Comparative Example 2) that is higher than 5 wt %, a rolling crack of about 3 mm occurred that is just the same as that of the reference, so that "Δ" is given. When the bismuth content is 7 wt % (Comparative Example 3), a rolling crack of more than 3 mm occurred, so that "×" is given, and thus an excellent result could not be provided.

Next, except for the alloy foil 1F with the bismuth content of 7 wt % (Comparative Example 3) that had caused the rolling crack, the alloy foils 1F with the bismuth content of 0.5 to 5 wt % were each subjected to annealing (heat) treatment under nitrogen atmosphere at 200° C. for 48 hrs. Then, as shown in FIG. 1B, the alloy foils 1F after annealing treatment were each inserted between the semiconductor element for electric power 2 made of SiC (0.3 mm thick×5 mm×5 mm) whose surface to be bonded was covered with gold (surface layer 2f) and the DBC board 3 (in the figure, only a portion of the conductive layer 3a is shown) whose surface to be bonded was applied with silver plating (surface layer 3f was formed). In that state, they were placed in a reductive atmosphere by formic acid and heated up from the ambient temperature, and at the time of reaching the bonding temperature of 300° C., the temperature was made unchanged and held for 10 min as a bonding period of time while pressing them at 10 MPa. Because of such heating and pressing, it is possible to promote: a solid-phase diffusion reaction between gold of the surface layer 2f as an element's electrode and the alloy foil 1F (formation of a diffusion layer Ld2 due to solid-phase diffusion of silver contained in the alloy into gold of the element's electrode); and a solid-phase diffusion reaction between silver of the surface layer 3f on the DBC board 3 and the alloy foil 1F (formation of a diffusion layer Ld3 due to diffusion of silver contained in the alloy into silver on the DBC board 3-side). After that holding, pressing was stopped, followed by cooling, to thereby obtain each of the evaluation samples 10S (Examples 1 to 3, Comparative Examples 1 to 2).

Then, the evaluation samples 10S were placed in a heat cycle apparatus and subjected to a thermal shock test under the condition of −55° C.×30 min/200° C.×30 min. At the time the thermal shock cycles reached 1000 cycles, the evaluation samples 10s were taken out from the apparatus, and subjected to observation of a diagonal cross-section of the element (observation length: 10 mm×√2≈14 mm), to thereby measure a crack length at the edge of the bonding portion. When a crack occurs in the bonding portion, heat dissipation ability at that place is impaired, and so a crack length that affects heat dissipation ability in practical use is defined as 1.4 mm that corresponds to 10% of the total length of 14 mm. Further, the heat cycle resistivity (in the table, "H/C resistivity") is evaluated as "×" if the crack length was 1.4 mm or more, and evaluated as "○" if it was less than 1.4 mm.

As a result, when the bismuth content is 1 wt % (Example 1), 3 wt % (Example 2) or 5 wt % (Example 3), namely, in the range of 1 to 5 wt %, the crack extension was less than 1.4 mm and thus excellent (○). In contrast, when the bismuth content is 0.5 wt % (Comparative Example 1) that is less than 1 wt %, the crack extended 1.4 mm or more, resulting in "×", and also when it is 6 wt % (Comparative Example 2) that is more than 5 wt %, the crack extended 1.4 mm or more, resulting in "×". The reason is thought to be that, when the bismuth content is in the range of 1 to 5 wt %, bismuth added to silver serves to finely divide the silver crystal grains, so that the ductility is improved. Further, it would be thought that, when the annealing treatment is applied to the Ag—Bi alloy foil 1F before bonding, this removes work-hardening occurred at the time of rolling and, furthermore, this accelerates the silver crystal grains and a partly-precipitated bismuth-rich precipitation phase to be dispersed finely, to thereby increase crystal grain boundaries resulting in promoting grain boundary sliding, so that promotion of softening and improvement of the ductility are achieved.

Figure 3A:
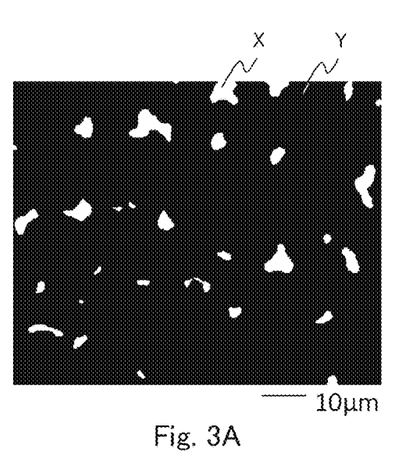
FIG. 3A and FIG. 3B is cross-sectional schematic view of the bonding material according to Embodiment 1 of the invention.
Figure 3B:
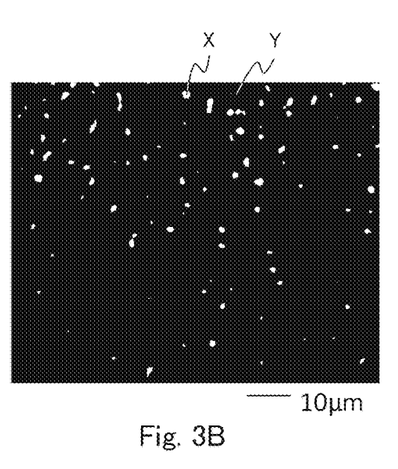

Typical cross-section pictures of the bonding material are shown in FIG. 3. In FIG. 3, shown at FIG. 3A is the cross-section picture before annealing and, at FIG. 3B is that after annealing. Further, a white color portion is the bismuth-rich precipitation phase X, and black color shows a base-material (Ag) phase Y. For measuring the grain size of the bismuth-rich precipitation phase X, the imaging software of "ImageJ" was used. Specifically, the cross-section picture was binarized to thereby display the bismuth-rich precipitation phase X in white color, and then the white color portion was enclosed and its area S was calculated according to a scale estimated beforehand. From the area S thus obtained, a grain size L was calculated on the basis of the following formula.

$$S = \pi \times (L/2)^2 \quad (1)$$

S: area, L: grain size of the bismuth-rich precipitation phase $$L = \sqrt{(4 \times S/\pi)} \quad (2)$$

As a result, when the bismuth content is from 1 to 5 wt %, the grain size of the bismuth-rich precipitation phase X was from 3 to 8 μm before annealing (FIG. 3A) but from 0.2 to 1.0 μm after annealing (FIG. 3B), and it is thought that the above mechanism is supported also by that fact.

Since silver has a thermal conductivity higher than that of bismuth, it is preferable not to add bismuth from a viewpoint of thermal conductivity. However, for example, the thermal conductivity of a tin (Sn)-based or lead (Pb)-based soldering material is about 50 W/m·K, and the thermal conductivity of pure silver is approx. 420 W/m·K. Meanwhile, when measured using an optical AC method at BETHEL Co., Ltd. JAPAN, the alloy 1F whose bismuth content is from 1 to 5 wt % had a thermal conductivity in a range of approx. 150 to 300 W/m·K, so that it is ascertained that the alloy is about three times higher in thermal conductivity than the solder and thus is a superior material in heat dissipation ability.

<Heat Treatment Condition (Temperature)>

Next, investigation was made about an optimum value of the temperature for annealing treatment. The sample alloys 1R whose bismuth content had been set from 1 to 5 wt % were rolled into the alloy foils 1F, and thereafter, using an annealing temperature as a parameter, they were subjected to heat treatment while fixing the annealing time to 48 hrs that is the same as the above. Then, according to similar processing to the above, eight evaluation samples 10S (Examples 4 to 7, Comparative Examples 4 to 7) were prepared and their degrees of crack extension were evaluated by cross-section observation after cycles of heating. The evaluation results are shown in Table 2.

TABLE 2

Parameter Test Result 2

| | Test Condition | | | Evaluation Result | |
|---|---|---|---|---|---|
| | Bi | Annealing Condition | | | |
| Test Object | Content [wt %] | Temperature [° C.] | Time [hrs] | Rolling Crack | H/C Resistivity |
| Comparative Example 4 | 1 | 140 | 48 | ◯ | X |
| Example 4 | 1 | 150 | 48 | ◯ | ◯ |
| Example 5 | 1 | 300 | 48 | ◯ | ◯ |
| Comparative Example 5 | 1 | 320 | 48 | ◯ | X |
| Comparative Example 6 | 5 | 140 | 48 | ◯ | X |
| Example 6 | 5 | 150 | 48 | ◯ | ◯ |
| Example 7 | 5 | 300 | 48 | ◯ | ◯ |
| Comparative Example 7 | 5 | 320 | 48 | ◯ | X |

As a result, from the evaluation results of Example 4 and Example 6 in which the annealing temperature is set to 150° C. and Example 5 and Example 7 in which it is set to 300° C., the crack extension was less than 1.4 mm in the range where the annealing temperature is from 150° C. to 300°, resulting in "◯". Meanwhile, when the annealing temperature is 140° C. (Comparative Example 4, Comparative Example 6) that is lower than 150° C., the crack extended 1.4 mm or more because softening due to structural refinement of the Ag—Bi alloy was not accelerated and thus the stress-relaxation ability was low, resulting in "X". When the annealing temperature is 320° C. (Comparative Example 5, Comparative Example 7) that is higher than 300° C., the crack extended 1.4 mm or more, resulting in "X", probably because, instead of finely-dispersing effect, coarsening of the crystal grain of bismuth emerged due to heat and acted so as to suppress grain boundary sliding, so that the stress-relaxation ability became lower. According to this result, it is ascertained that there is proper values (range) for the annealing temperature and, in the case of Ag—Bi alloy whose bismuth content is from 1 to 5 wt %, the proper values are from 150 to 300° C.

<Heat Treatment Condition (Time)>

Next, investigation was made about an optimum value of the treatment time for annealing. The sample alloys 1R whose bismuth content had been set from 1 to 5 wt % were rolled into the alloy foils 1F, and thereafter, using an annealing time as a parameter, they were subjected to heat treatment at each of the annealing temperatures of the upper limit and the lower limit having been described above. Then, according to similar processing to the above, nineteen evaluation samples 10S (Examples 8 to 19, Comparative Examples 8 to 14) were prepared and their degrees of crack extension were evaluated by cross-section observation after cycles of heating. The evaluation results are shown in Table 3.

TABLE 3

Parameter Test Result 3

| | Test Condition | | | Evaluation Result | |
|---|---|---|---|---|---|
| | Bi | Annealing Condition | | | |
| Test Object | Content [wt %] | Temperature [° C.] | Time [hrs] | Rolling Crack | H/C Resistivity |
| Comparative Example 8 | 1 | 150 | 8 | ◯ | X |
| Example 8 | 1 | 150 | 10 | ◯ | ◯ |
| Example 9 | 1 | 150 | 30 | ◯ | ◯ |
| Example 10 | 1 | 150 | 100 | ◯ | ◯ |
| Comparative Example 9 | 5 | 150 | 8 | ◯ | X |
| Example 11 | 5 | 150 | 10 | ◯ | ◯ |
| Example 12 | 5 | 150 | 30 | ◯ | ◯ |
| Example 13 | 5 | 150 | 100 | ◯ | ◯ |
| Comparative Example 10 | 1 | 300 | 8 | ◯ | X |
| Example 14 | 1 | 300 | 10 | ◯ | ◯ |
| Example 15 | 1 | 300 | 30 | ◯ | ◯ |
| Example 16 | 1 | 300 | 100 | ◯ | ◯ |
| Comparative Example 11 | 5 | 300 | 8 | ◯ | X |
| Example 17 | 5 | 300 | 10 | ◯ | ◯ |
| Example 18 | 5 | 300 | 30 | ◯ | ◯ |
| Example 19 | 5 | 300 | 100 | ◯ | ◯ |
| Comparative Example 12 | 5 | 300 | 8 | ◯ | X |
| Comparative Example 13 | 1 | 300 | 120 | ◯ | X |
| Comparative Example 14 | 5 | 300 | 120 | ◯ | X |

As a result, at the annealing temperature of 150 or 300°, when the annealing time is set to 10 hrs (Example 8, Example 11, Example 14, Example 17), when it is set to 30 hrs (Example 9, Example 12, Example 15, Example 18) and when it is set to 100 hrs (Example 10, Example 13, Example 16, Example 19), namely, when the annealing time is in the range from 10 to 100 hrs, the crack extension was less than 1.4 mm, resulting in "○". When the annealing time is set to 8 hrs (Comparative Example 8, Comparative Example 9, Comparative Example 10, Comparative Example 11) that is shorter than 10 hrs, the crack extended 1.4 mm or more because softening due to structural refinement of the Ag—Bi alloy was not accelerated and thus the stress-relaxation ability was low, resulting in "×".

In the case where the temperature for annealing treatment is 300° C. that is the upper limit in the temperature range, when the sample was held for 120 hrs that is beyond the above time range, the stress-relaxation ability became lower, and thus the crack extended 1.4 mm or more, resulting in "×". The reason is thought to be that, instead of finely-dispersing effect, coarsening of the crystal grain of bismuth emerges due to heat and acts so as to suppress grain boundary sliding. Note that, in that temperature range, when the temperature is lower then 300° C., it has been confirmed that the heat cycle resistivity and the crack resistivity are both given as "○" up to the holding time of 100 hrs; however, it is unknown what extent of finely-dispersing effect emerges in the case of time longer than that. In mass production processes, it is, however, desired that a treatment be as short as possible, so that when the annealing treatment consumes 100 hrs (approx. 4 days) or more, it is unsuitable as a mass production process from the viewpoint of takt time. Accordingly, if the crack resistivity is ascertained in the range of treatment up to 100 hrs, there is no problem in mass production. According to this result, it is ascertained with respect to the time period for annealing treatment, that in the case of annealing treatment at 150 to 300° C. for the Ag—Bi alloy whose bismuth content is from 1 to 5 wt %, excellent results are obtained if it is from 10 to 100 hrs.

With respect to the bonding condition, a bonding atmosphere, a bonding temperature, an applied pressure and a holding time are mainly given as parameters. In the aforementioned parameter test, a reductive atmosphere by formic acid was used as the bonding atmosphere; however, it may be a reductive atmosphere by hydrogen.

With respect to the bonding temperature, it just has to be a temperature that promotes a solid-phase diffusion reaction between the metal covering the bonding face of the bonding target and the Ag—Bi alloy and, although it was set to 300° C. in the parameter test, a similar effect can be achieved if it is in the range of 250 to 300° C. If the bonding temperature is set to a temperature lower than 250° C., the solid-phase diffusion reaction with the bonding face is not accelerated, so that an excellent bonding portion can not be provided. Note that, even when it is set to a temperature lower than 250° C., diffusion proceeds if the holding time is set longer; however, this is thought to be practically inapplicable in consideration of mass production processes.

Meanwhile, if the bonding temperature is set to a temperature higher than 300° C., this results in occurrence of softening of copper that constitutes the conductive layers $3a$, $3b$ of the DBC board 3. Accordingly, if the evaluation sample $10s$ is prepared at a bonding temperature higher than 300° C., even though the bonding portion is initially excellent, when the sample is then subjected to the heat cycle test, a warpage occurs in the DBC board 3 and its surface is undulated into an uneven shape. Upon this occasion, at an edge of the bonding portion, a crack occurs due to the warpage of the DCB board 3, and at the inside of the bonding portion, a crack vertical to the bonding face occurs because of not being able to follow the unevenness in the DBC board 3. Thus, the bonding temperature is preferably from 250° C. to 300° C.

With respect to the bonding time, it just has to be a time period where a solid-phase diffusion reaction occurs between the metal covering the bonding face of the bonding target and the Ag—Bi alloy and, although it was set to 10 min in the above, an excellent bonding portion has been obtained even when it was 5 min. When the bonding time is too long, it is disadvantageous because the take time in the mass production process is long, so that 5 to 10 min is most suitable.

The applied pressure depends on a flatness of the bonding face, and the surface flatness Ra of each semiconductor element for electric power 2 used in the evaluation herein was 50 nm or less and the surface flatness Ra of each DBC board 3 used in the evaluation was 1 µm or less. With such flatness, excellent bonding has been achieved when the Ag—Bi-series alloy foil 1F was pressed at 10 to 30 MPa. Note that, as the alloy foils 1F, those having the surface flatness Ra of 1 µm each were used.

With respect to the metal that covers the bonding face, when it is gold, silver, copper or any combination thereof, excellent bonding can be achieved both for the semiconductor element for electric power 2 and the DBC board 3. Note that although a good bonding portion can be achieved even it is tin, the melting point of tin is about 230° C. and thus, it will be molten at the bonding temperature of 250 to 3000. On that occasion, silver will diffuse into tin to thereby form a tin-silver eutectic phase (Sn-3Ag (wt %)) having a melting point of 220° C. as well as a fine intermetallic compound ($Ag_3Sn$). This impairs the heat resistivity and thus is not preferable. Further, this is not preferable because bismuth will diffuse into tin to thereby form a tin-bismuth eutectic phase (Sn-58Bi (wt %)) having a melting point of 138° C., thus impairing the heat resistivity.

Note that when there is a demand to make bonding to the surface of tin, it is necessary to heat enough that a tin-only phase, or a tin-silver eutectic phase or tin-bismuth eutectic phase, each being low in melting point, does not remain at the interface between Sn and the Ag—Bi alloy. Further, it is necessary to cause the interface portion to be entirely formed of at least an intermetallic compound of $Ag_3Sn$ or $Ag_5Sn$.

In the semiconductor device for electric power 100 according to Embodiment 1, with respect to the bonding target, a case has been shown in which the Ag—Bi alloy bonding material 1 is used for the bonding between the semiconductor element for electric power 2 and the DBC board 3, or the bonding between the semiconductor element for electric power 2 and the lead terminal 4.

However, in a semiconductor device for electric power 100, a heat-dissipation plate is provided under the circuit board generally without being limited to the DBC board 3, so that it is allowable to also apply the bonding material 1 of the invention to the bonding between the circuit board and the heat-dissipation plate.

Further, in the semiconductor device for electric power 100 according to Embodiment 1, a case has been shown in which silicon carbide is used for the semiconductor element for electric power 2 serving as the switching element or the rectifier element; however, this is not limitative, so that a conventional silicon-based element may also be applied. Notwithstanding, in the case of using an element which is so-called as a wide bandgap semiconductor element of such as, silicon carbide, a gallium nitride-series material or diamond, since it is lower in power loss than the conventionally-used element formed of silicon, the efficiency of the semiconductor device for electric power 100 can be enhanced. Further, it is high in withstanding voltage and also high in allowable current density and thus, the semiconductor device for electric power 100 can be downsized. Furthermore, the wide bandgap semiconductor element is high in heat resistivity and thus allows a high-temperature operation. This also allows downsizing of a heat-dissipation fin of the heatsink and substitution of a water-cooled unit with an air-cooled one, so that the semiconductor device for electric power 100 can be more downsized.

Meanwhile, in order to develop the ability of a wide bandgap semiconductor element, it is necessary to decrease the electric resistance at the time a current flows in the semiconductor element for electric power 2 and to efficiently dissipate heat generated in the semiconductor element for electric power 2. Thus, when the semiconductor element for electric power 2 is mounted using the Ag—Bi alloy-based bonding material 1 described in the embodiment of the invention, a highly-reliable semiconductor device for electric power 100 can be achieved because, not only a superior heat-dissipation ability and electric conductivity is provided, but also a strong bonding can be kept during cycles of heating at its production and/or at its operation.

As described above, in accordance with the bonding material 1 according to this embodiment, it is a sheet-like bonding material 1 made of a silver-bismuth alloy which, when heated in a state being in contact with a metal material as a bonding target (for example, the surface layer 2$f$ as an element's electrode of the semiconductor element for electric power 2, and the surface layer 3$f$ on the conductive layer 3$a$ of the DBC board 3), forms in the metal material (as its material, for example, gold, silver or copper) a diffusion layer Ld2, Ld3 of silver due to solid-phase diffusion reaction, so as to be bonded to the metal material, wherein the bonding material is configured to contain not less than 1 mass % but not more than 5 mass % of bismuth. Thus, it is possible to reduce the elastic modulus adequately, to thereby achieve bonding which satisfies both in heat resistivity and in stress-relaxation ability.

Further, the bonding material 1 is a rolled material having a thickness of 50 μm to 100 μm, so that the bonded object 10 can be formed without too much increasing its thickness and thus, a compact and highly-efficient semiconductor device for electric power 100 can be manufactured easily. In addition, it is possible to easily establish flatness accuracy suited to such bonding.

Meanwhile, in accordance with the bonding method according to this embodiment, it is provided so as to include: a heat treatment step of heat treating the bonding material 1 at a temperature of not less than 150° C. but not more than 300° C.; and a diffusion-layer forming step of sandwiching the bonding material 1 after subjected to the heat treatment step between two bonding targets (for example, semiconductor element for electric power 2, DBC board 3), and heating them at a temperature lower than the melting point of the bonding material 1, to thereby form a diffusion layer of silver Ld2, Ld3 in each of said two bonding targets. Thus, it is possible to achieve a strong bonding that is superior in stress-relaxation ability.

When the time period for heat treating in the heat treatment step is set to not less than 10 hours but not more than 100 hours, it is possible to surely achieve the stress relaxation effect.

Because the heating temperature in the diffusion-layer forming step is not less than 250° C. but not more than 300° C., it is possible to achieve a strong bonding without degrading the bonding target.

Because the diffusion-layer forming step is performed in a reductive atmosphere (for example, a formic-acid atmosphere or a hydrogen atmosphere), there is no occurrence of oxidized coating film at the bonded face of the bonding material 1 or the bonding target, thus making it possible to surely form the diffusion layers of silver Ld2, Ld3.

Meanwhile, in accordance with the semiconductor device for electric power 100 according to this embodiment, it comprises a circuit board (DBC board 3) on which a circuit pattern (conductive layer 3$a$) is formed, and a semiconductor element for electric power 2 bonded to the circuit pattern (conductive layer 3$a$), wherein the semiconductor element for electric power 2 and the circuit pattern (conductive layer 3$a$) are bonded by the bonding method according to this embodiment. Thus, the bonding between the semiconductor element for electric power 2 and the DBC board 3 is high in heat resistivity and is provided with stress-relaxation ability. Accordingly, it is possible to provide a highly-reliable semiconductor device for electric power 100 that keeps strong bonding even if subjected to a high-temperature operation or a power cycle.

Because, on each of mutually facing surfaces of the semiconductor element for electric power 2 and the circuit pattern (conductive layer 3$a$), a metal layer 2$f$, 3$f$ of any one of gold, silver and copper is formed as a metal material, the diffusion layers of silver Ld2, Ld3 can surely be provided.

DESCRIPTION OF REFERENCE NUMERALS AND SIGNS

1: bonding material, 1F: alloy foil (bonding material), 2: semiconductor element for electric power, 2$f$: surface layer, 3: DBC board (circuit board), 3$a$: conductive layer (circuit pattern), 3$f$: surface layer, 4: lead terminal, 5: sealing material, 10 bonded object, 10S: evaluation sample, 100: semiconductor device for electric power.

The invention claimed is:

1. A bonding material comprising:
   an alloy containing bismuth and composed mainly of silver, which, when heated in a state being in contact with a metal material as a bonding target, forms in the metal material a diffusion layer of silver due to solid-phase diffusion reaction, so as to be bonded to the metal material,
   wherein said bonding material contains not less than 1 mass % but not more than 5 mass % of bismuth, and
   wherein, in the silver-bismuth alloy, a grain size of bismuth-rich phase is 0.2 to 1.0 μm.

2. The bonding material according to claim 1, which is a plate material having a thickness of 50 μm to 100 μm.

3. A method of bonding by use of the bonding material according to claim 1, comprising:
   a heat treatment step of heat treating the bonding material at a temperature of not less than 150° C. but not more than 300° C.; and
   a diffusion-layer forming step of sandwiching the bonding material after subjected to the heat treatment step between two bonding targets, and heating them at a temperature lower than a melting point of the bonding material, to thereby form the diffusion layer of silver in each of said two bonding targets.

4. The bonding method according to claim 3, wherein a time period for heat treating is not less than 10 hours but not more than 100 hours.

5. The bonding method according to claim 3, wherein the temperature in the diffusion-layer forming step is not less than 250° C. but not more than 300° C.

6. The bonding method according to claim 3, wherein the diffusion-layer forming step is performed in a reductive atmosphere.

7. A method of bonding by use of the bonding material according to claim 1, comprising:
   a heat treatment step of heat treating the bonding material at a temperature of not less than 150° C. but not more than 300° C.; and
   a diffusion-layer forming step of sandwiching the bonding material after subjected to the heat treatment step between two bonding targets, and heating them at a temperature lower than a melting point of the bonding material, to thereby form the diffusion layer of silver in each of said two bonding targets.

8. The bonding method according to claim 7, wherein a time period for heat treating is not less than 10 hours but not more than 100 hours.

9. The bonding method according to claim 7, wherein the temperature in the diffusion-layer forming step is not less than 250° C. but not more than 300° C.

10. The bonding method according to claim 7, wherein the diffusion-layer forming step is performed in a reductive atmosphere.

11. A semiconductor device for electric power comprising:
    a circuit board on which a circuit pattern is formed; and
    a semiconductor element for electric power bonded to the circuit pattern;
    wherein a bonding portion between the circuit board and the semiconductor element for electric power is formed of: a first diffusion layer formed in the side of the semiconductor element for electric power; a bonding material made of an alloy containing bismuth and composed mainly of silver; and a second diffusion layer formed in the side of the circuit board; and
    wherein the first diffusion layer and the second diffusion layer are provided by diffusion of silver from the bonding material to thereby be bonded to the bonding material.

12. The semiconductor device for electric power according to claim 11, wherein the first diffusion layer and the second diffusion layer are formed in such a manner that silver diffuses into a metal layer of any one of gold, silver and copper.

13. The semiconductor device for electric power according to claim 12, wherein the semiconductor element for electric power is formed of a wide bandgap semiconductor material.

14. The semiconductor device for electric power of claim 13, wherein the wide bandgap semiconductor material is one of silicon carbide, a gallium nitride-series material or diamond.

15. The semiconductor device for electric power according to claim 11, wherein the semiconductor element for electric power is formed of a wide bandgap semiconductor material.

16. The semiconductor device for electric power of claim 15, wherein the wide bandgap semiconductor material is one of silicon carbide, a gallium nitride-series material or diamond.

17. An alloy that is predominantly silver and that comprises 1 mass % to 5 mass % bismuth, wherein said alloy when placed in contact with a metal material at a temperature ranging from 150° C. to 300° C. forms a diffusion layer of silver thus bonding it to the metal material.

18. A method of bonding at least two metals together comprising contacting each metal with an intervening amount of the alloy according to claim 17 at a temperature ranging from 150° C. to 300° C.

* * * * *